US012609275B2

(12) United States Patent
Edge et al.

(10) Patent No.: US 12,609,275 B2
(45) Date of Patent: Apr. 21, 2026

(54) ORIENTATION TOOL FOR ELECTRON BACKSCATTER DIFFRACTION

(71) Applicant: GM Global Technology Operations LLC, Detroit, MI (US)

(72) Inventors: Chelsea Edge, Ferndale, MI (US); Melissa Rose Galant, Clawson, MI (US); Wei Wu, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 379 days.

(21) Appl. No.: 18/323,669

(22) Filed: May 25, 2023

(65) Prior Publication Data

US 2024/0395498 A1     Nov. 28, 2024

(51) Int. Cl.
H01J 37/28          (2006.01)
H01J 37/20          (2006.01)

(52) U.S. Cl.
CPC .............. H01J 37/28 (2013.01); H01J 37/20 (2013.01); *H01J 2237/032* (2013.01); *H01J 2237/20292* (2013.01); *H01J 2237/24475* (2013.01)

(58) Field of Classification Search
CPC .. H01J 37/00; H01J 37/02; H01J 37/26; H01J 37/28; H01J 37/20; H01J 2237/032; H01J 2237/20292; H01J 2237/24475; H01J 2237/2007; G01Q 30/02; G01N 23/20016; G01N 23/20058; G01N 23/203

USPC ............................................. 250/311, 442.11
See application file for complete search history.

(56) References Cited

U.S. PATENT DOCUMENTS

| | | | | |
|---|---|---|---|---|
| 4,803,358 A | * | 2/1989 | Kato ....................... | H01J 37/28 250/442.11 |
| 7,005,652 B1 | * | 2/2006 | Vanderlinde .......... | H01J 37/244 250/397 |
| 2011/0017922 A1 | * | 1/2011 | Amador .................. | H01J 37/20 250/442.11 |

* cited by examiner

*Primary Examiner* — Jason L Mccormack
(74) *Attorney, Agent, or Firm* — Vivacqua Crane, PLLC

(57)          ABSTRACT

An orientation tool for orienting a sample mount having a sample for evaluation by a scanning electron microscope using an electron backscatter diffraction detector includes a body having a bottom surface and a top surface, an angled flat face extending from the bottom surface to the top surface, and a mount portion formed in the body between the top surface and the angled flat face. The mount portion is defined by a wall and a support surface. The wall extends from the top surface to the support surface and the support surface extends from the wall to the angled flat face. The wall is angled at 20 degrees with respect to an imaginary vertical line perpendicular to the bottom surface. The mount portion is sized to receive the sample mount and orient the sample relative to the electron backscatter diffraction detector.

20 Claims, 4 Drawing Sheets

ORIENTATION TOOL FOR ELECTRON BACKSCATTER DIFFRACTION

INTRODUCTION

The present disclosure relates to an orientation tool for analyzing samples using electron backscatter diffraction (EBSD) techniques to determine the microstructure of a material. Microstructure is the internal structure of a material investigated on a microscopic scale and is of interest because a material's internal structure influences its properties and behavior. An EBSD technique uses a scanning electron microscope (SEM) to direct electrons to a tilted sample of crystalline material, wherein atoms are arranged to repeat periodically. Electrons from the crystalline material are backscattered and strike a phosphor screen of an EBSD detector and produce light that is detected by a camera of the EBSD detector. Because some of the scattered electrons impinge upon planes of atoms in the crystalline material in such a way that conditions for Bragg diffraction are satisfied, pairs of curved lines for each lattice plane can be formed. Analyzing the symmetry and appearance of the detected diffraction patterns allows for the microstructure of the sample to be determined. Results of an EBSD analysis may include the identification and/or characterization of grain populations, different phases or compounds in the material, spatial distribution of elements, nature of interfaces between and within grains, texture, and the like.

Current setups for EBSD evaluation include a tilting mechanism, wherein a crystalline sample is attached to a fixture for an SEM and the evaluation surface is then tilted to an angle of around 70 degrees from horizontal. This procedure increases the risk of damage to other components in the SEM, such as the electron beam column, EBSD detector, or an EDS (energy dispersive X-ray spectroscopy) component, risking repairs and downtime. This procedure also requires a long settling time of the sample (e.g., typically 45 minutes to two hours) prior to EBSD evaluation, because once tilted from a horizontal orientation, gravity causes the sample to drift downward. For accurate measurement, a sample needs to be settled prior to evaluation because the resolution of the evaluation is on the order of microns.

Thus, while current EBSD components and procedures enable appropriate analysis, there exists a need for an orientation tool and procedures that provide better efficiency for test sample evaluation, lessen the risk of SEM component damage, provide stability and repeatability for sample orientation, and enhance data quality.

SUMMARY

Further areas of applicability will become apparent from the description provided herein. It should be understood that the description and specific examples are intended for purposes of illustration only and are not intended to limit the scope of the present disclosure.

An orientation tool for orienting a sample mount having a sample for evaluation by a scanning electron microscope using an electron backscatter diffraction detector is provided. The orientation tool includes a body having a bottom surface and a top surface, an angled flat face extending from the bottom surface to the top surface, and a mount portion formed in the body between the top surface and the angled flat face. The mount portion is defined by a wall and a support surface. The wall extends from the top surface to the support surface and the support surface extends from the wall to the angled flat face. The wall is angled at 20 degrees with respect to an imaginary vertical line perpendicular to the bottom surface. The mount portion is sized to receive the sample mount and orient the sample relative to the electron backscatter diffraction detector.

In one aspect, the orientation tool further includes a locating flange extending out from the body to locate the orientation tool within the scanning electron microscope.

In another aspect, the wall is planar and abuts a back surface of the sample mount.

In another aspect, the support surface is semi-circular.

In another aspect, the angled flat face is angled with respect to the bottom surface at an angle less than 90 degrees.

In another aspect, the support surface is disposed 90 degrees relative to the wall.

In another example of the present disclosure, a system for evaluating a sample within a scanning electron microscope (SEM) is provided. The system includes a locating collar configured to be fixed within the SEM, a sample mount having a back surface, a polished surface, and a side surface extended from the back surface to the polished surface, wherein the sample is fixed to the polished surface, and an orientation tool disposed within the locating collar. The orientation tool includes a body having a bottom surface and a top surface, an angled flat face extending from the bottom surface to the top surface, and a mount portion formed in the body between the top surface and the angled flat face. The mount portion is defined by a wall and a support surface. The wall extends from the top surface to the support surface and the support surface extends from the wall to the angled flat face. The wall is angled at 20 degrees with respect to an imaginary vertical line perpendicular to the bottom surface. The sample mount is disposed within the mount portion and the back surface abuts the wall, the side surface abuts the support surface, and the polished surface is angled at 20 degrees relative to a vertical axis of the SEM.

In one aspect, the locating collar includes a slot formed in an upper surface of the locating collar.

In another aspect, the orientation tool includes a locating flange extending out from the body, and the locating flange is disposed within the slot of the locating collar to orient the orientation tool relative to the locating collar.

In another aspect, the wall and back surface are planar.

In another aspect, the support surface and side surface are complimentary shapes.

In another aspect, the angled flat face is angled with respect to the bottom surface at an angle less than 90 degrees.

In another aspect, the support surface is disposed 90 degrees relative to the wall.

In another aspect, an electron backscatter diffraction (EBSD) detector is disposed within the SEM, wherein the orientation tool orients the sample mount and the sample relative to the EBSD detector at an angle.

In another aspect, the back surface and the polished surface of the sample mount are parallel to each other.

In another aspect, the sample mount is generally cylindrical.

In another example of the present disclosure, a method for initiating an electron backscatter diffraction measurement in a chamber of a scanning electron microscope (SEM) is provided. The method includes affixing a silicon calibration standard to the polished surface of a sample mount near an edge of the polished surface, placing the sample mount into a mount portion of an orientation tool, wherein the orientation tool orients the sample at an angle of 20 degrees from a vertical axis of the orientation tool, placing the orientation tool and sample on the sample mount into a locating collar, creating a conduction path from the sample to the locating collar using copper tape, and placing the locating collar with the sample into the chamber of the SEM with the sample facing toward an EBSD detector.

In one aspect, the method includes vibratory polishing the sample while in a horizontal position in the sample mount.

In another aspect, the method includes creating a conduction path from the sample to the locating collar using copper tape prior to placing the locating collar with the sample into the chamber of the SEM.

In another aspect, the method includes aligning the orientation tool relative to the locating collar by inserting a locating flange on the orientation tool into a slot in the locating collar.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
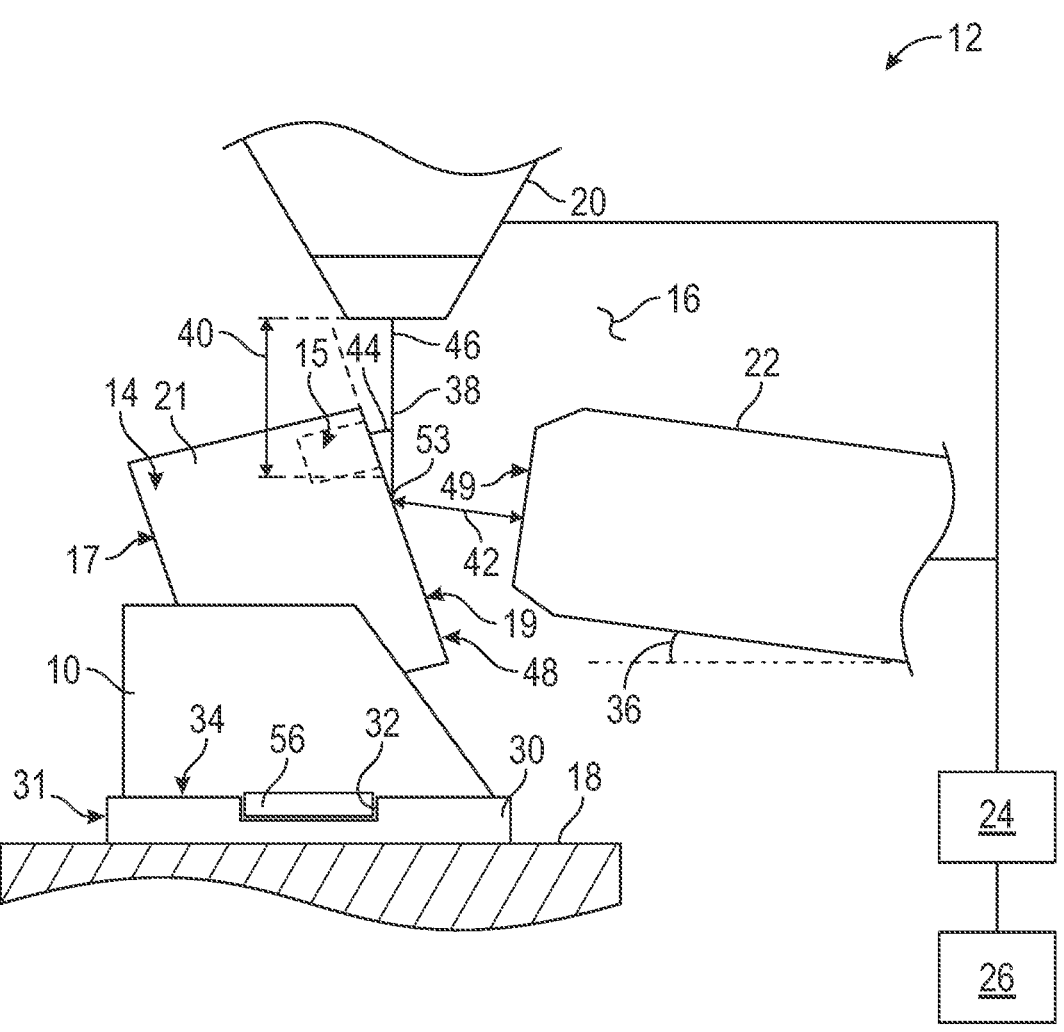
FIG. 1 is a simplified diagram of a scanning electron microscope using electron backscatter diffraction for evaluation of a sample crystalline material using an orientation tool.

FIG. 1 illustrates an orientation tool 10 according to the principles of the present disclosure used with an exemplary scanning electron microscope (SEM) 12. The orientation tool 10, which will be described in greater detail below, supports and positions a sample mount 14 within the SEM 12. The sample mount 14 supports a sample 15. The sample 15 may be any suitable material to be analyzed by the SEM 12. The sample mount 14 may be generally cylindrical or puck-shaped and includes a back surface 17 and a polished surface 19 opposite the back surface 17. A side surface 21 connects the back surface 17 with the polished surface 19. The back surface 17 and the polished surface 19 are parallel to one another. The sample 15 is preferably mounted to the sample mount 14 via metallographic mounting where a surface of the sample 15 aligns with a surface of the sample mount 14. In other words, the sample 15 is contained within the sample mount 14 with an evaluation area polished and shared with polished surface 19, preferably at an upper edge of the polished surface 19. Alternatively, the sample 15 may be mounted to the sample mount 14 via carbon tape. It should be appreciated that more than one sample 15 may be fixed to the polished surface 19.

The SEM 12 provides high-resolution, three-dimensional images of the sample 15 by using a focused beam of electrons to scan the surface. The SEM 12 generally includes a specimen chamber 16, a specimen stage 18, an electron beam column 20, a detector 22, a controller 24, and a display 26. The specimen chamber 16 is accessible by a user of the SEM 12 to add and remove the orientation tool 10 and the sample mount 14 from the SEM 12. The specimen chamber 16 is selectively placed under vacuum during operation of the SEM 12. The specimen stage 18 is disposed within the specimen chamber 16 and is in alignment with the electron beam column 20. The specimen stage 18 provides a fixed, level platform to support the orientation tool 10 within the specimen chamber 16. A locating collar 30 is connected to the specimen stage 18. The locating collar 30 is part of an SEM sample holder 31. The locating collar 30 includes a pair of slots 32 (only one of which is shown in FIG. 1) defined in an upper surface 34 of the locating collar 30. The locating collar 30 is used to locate and secure the orientation tool 10 on the specimen stage 18 in alignment with the electron beam column 20.

The electron beam column 20 directs electrons down to the sample mount 14 and sample 15 and generally includes an electron source (not shown) and electromagnetic lenses (not shown). The electron source may be a thermionic filament or field emission gun that generates an electron beam 38. The electron beam 38 follows a vertical axis of the electron beam column 20. The electromagnetic lenses focus, shape, and control the electron beam 38 across the sample mount 14.

The detector 22 is an electron backscatter diffraction (EBSD) detector. The detector 22 is used to analyze the crystallographic properties of materials. ESBD enables the characterization of crystal structures, grain orientations, grain boundaries, and other microstructural features of the sample 15. The detector 22 is mounted within the specimen chamber 16 and positioned at an angle 36 relative to the specimen stage 18. When an electron beam from the electron beam column 20 interacts with the sample 15, a fraction of the backscattered electrons carries information about the crystal lattice structure of the material. The detector 22 captures these backscattered electrons and analyzes their diffraction patterns. Generally, the detector 22 includes a phosphor screen or a semiconductor sensor that captures the backscattered electrons and converts them into visible light or electrical signals, respectively. This pattern of diffraction spots is then recorded by a camera or other means for further analysis.

The controller 24 generally runs software and programs to control the operation of the SEM 12. The controller 24 is in electronic communication with various components of the SEM 12, including at least the electron beam column 20 and the detector 22. The controller 24 may be a single controller or multiple connected controllers without departing from the scope of the present disclosure. The controller 24 is an electronic control device having a preprogrammed digital computer or processor, memory or non-transitory computer readable medium used to store data such as control logic, software applications, instructions, computer code, data, lookup tables, etc., and input/output ports. The computer readable medium includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device. Computer code includes any type of program code, including source code, object code, and executable code. The processor is configured to execute the code or instructions. The controller 24 can control the operation of the electron beam column 20, the location and operation of the detector 22, location of stage 18, maintain calibrations, and provide other known operational features for the SEM 12 including displaying information and imaging on the display 26.

In order to accurately analyze the sample 15, the specific geometry between the sample mount 14 and sample 15, the electron beam column 20, and the detector 22 must be controlled. This geometry is defined by a working distance 40, a detector distance 42, and a sample orientation angle 44. The working distance 40 is a straight line distance from a distal end 46 of the electron beam column 20 to a surface 48 of the sample mount 14. The detector distance 42 is the shortest distance from a phosphor screen 49 of the detector 22 to the beam-sample interaction point 53 where the electron beam 38 contacts the surface 48 of the sample mount 14. The sample orientation angle 44 is measured from a vertical line or a horizontal line to the surface 48 of the sample mount 14. The sample orientation angle 44 is preferably 20 degrees from the vertical line (or 70 degrees from a horizontal line).

The orientation tool 10 according to the principles of the present disclosure locates and supports the sample mount 14 within the specimen chamber 16 to consistently and accurately maintain and control the working distance 40, the detector distance 42, and the sample orientation angle 44. The orientation tool 10 is configured to sit within the locating collar 30. The orientation tool 10 pre-tilts the sample mount 14 and sample 15 for EBSD evaluation prior to insertion in the specimen chamber 16. The orientation tool 10 provides a repeatable tilt angle of the sample mount 14 and sample 15. Providing a pre-tilted sample 15 eliminates a settling time that would otherwise be required after inserting a sample into the specimen chamber 16 and then tilting the sample mount 14 since gravity causes surface atoms of the sample mount 14 to undergo movement, which would interfere with an EBSD analysis until an appropriate settling time has passed.

Figure 2:
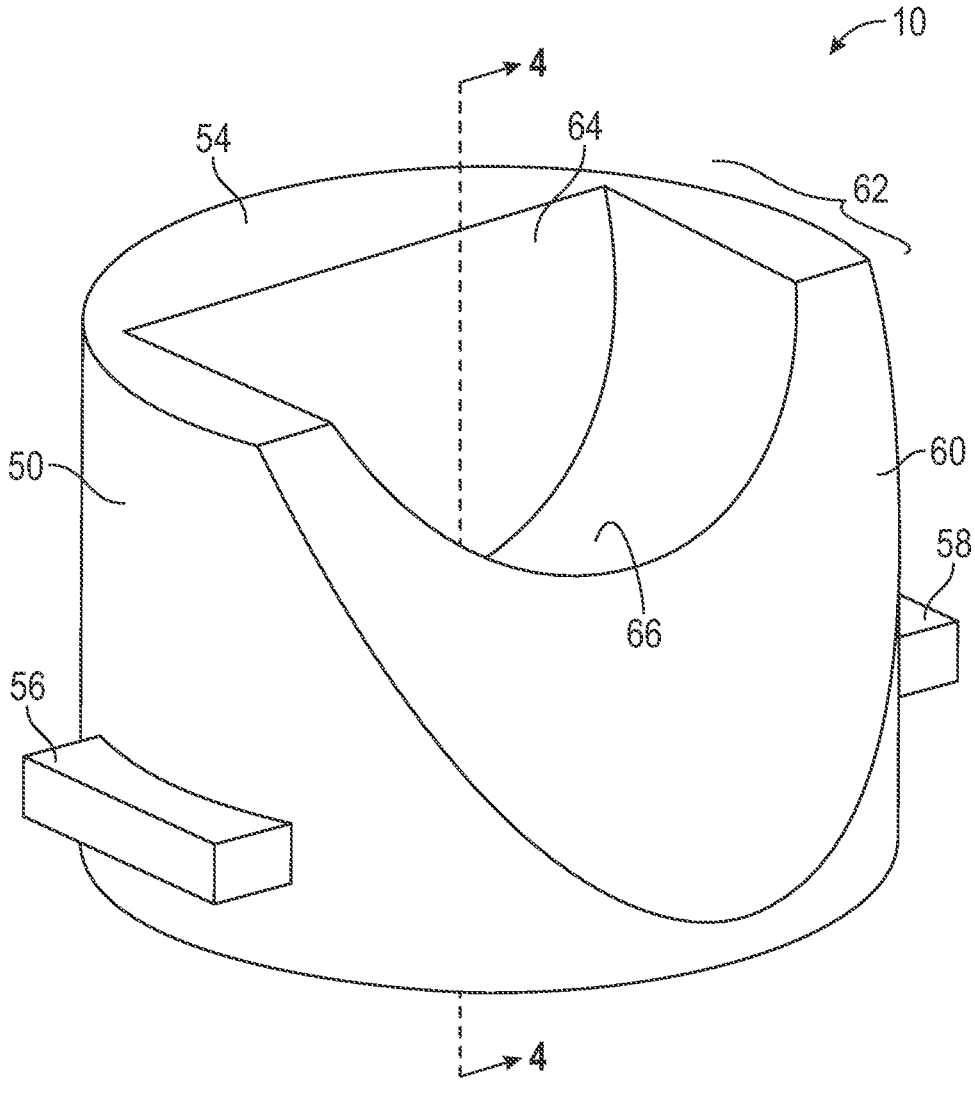
FIG. 2 is side perspective view of an example orientation tool.
Figure 3:
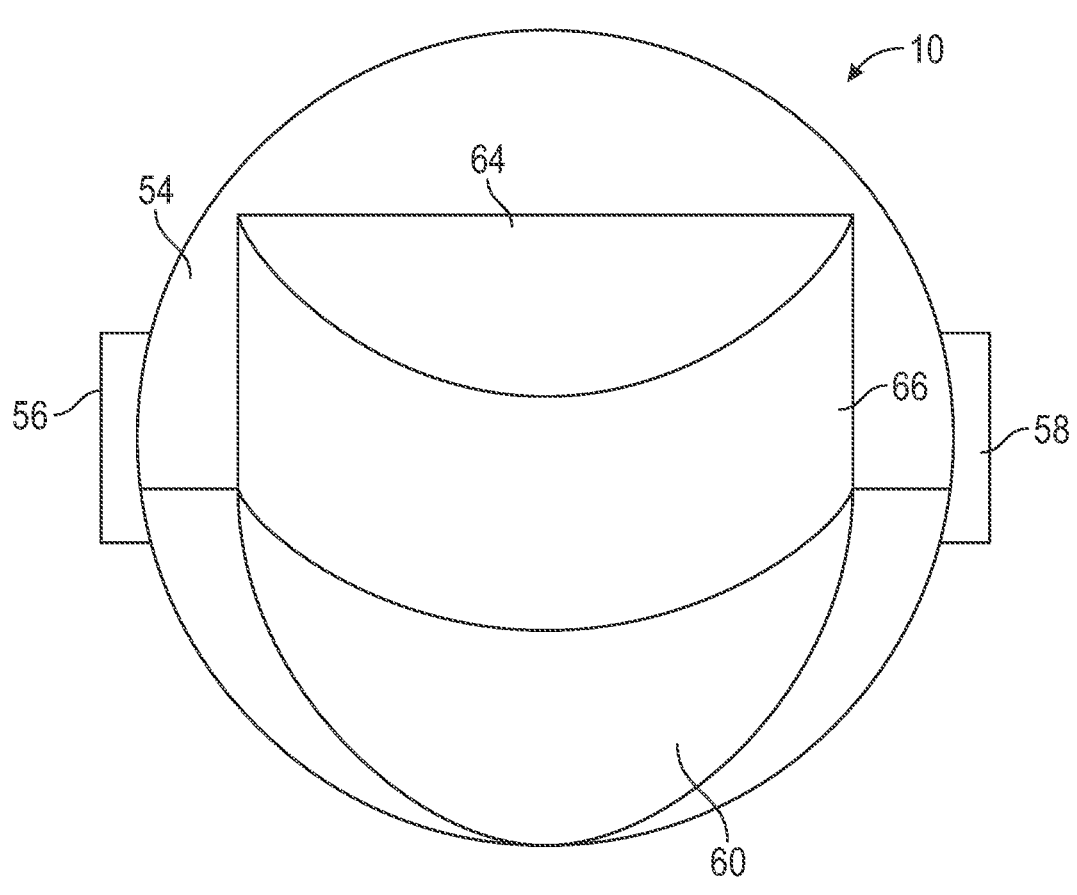
FIG. 3 is a top view of the orientation tool of FIG. 2.
Figure 4:
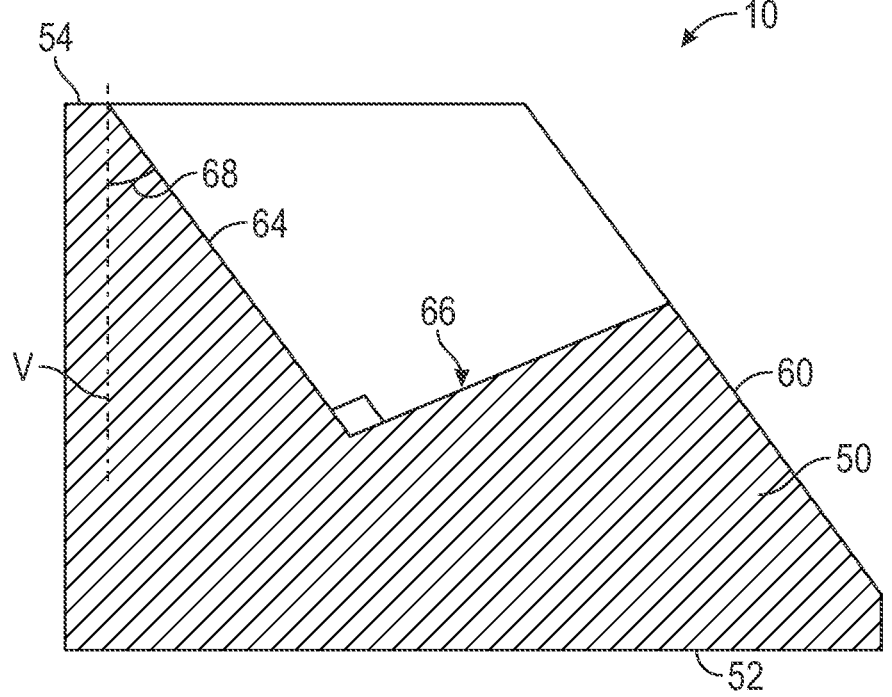
FIG. 4 is cross-section view taken in the direction of arrows 4-4 in FIG. 2.

Turning to FIGS. 2-4, the orientation tool 10 generally includes a body 50. The body 50 is generally cylindrical and includes a bottom surface 52 and a top surface 54. The bottom surface 52 is planar and contacts a surface of the SEM sample holder 31 when placed within the locating collar 30. A pair of locating flanges 56, 58 extend out from the body 50. The locating flanges 56, 58 are sized to fit within the slots 32 (FIG. 1) of the locating collar 30. The locating flanges 56, 58 locate and secure the orientation tool 10 within the locating collar 30. Thus, the locating collar 30 orients the orientation tool 10 when the SEM sample holder 31 is placed within the SEM 12 and inserted into a locating and holding feature in the specimen stage 18. The body 50 further includes an angled flat face 60 disposed between the locating flanges 56, 58. The angled flat face 60 is angled with respect to the bottom surface 52 at an angle less than 90 degrees. The angled flat face 60 extends adjacent the bottom surface 52 to the top surface 54. The angled flat face 60 allows the sample mount 14 and sample 15 to be located as close as possible to the detector 22 without interference from the body 50 of the orientation tool 10.

The orientation tool 10 further includes a mount portion 62 for holding the sample mount 14. The mount portion 62 is formed in the body 50 between the top surface 54 and the angled flat face 60 opposite the bottom surface 52. The mount portion 62 is a cut-out in the orientation tool 10 defined by a wall 64 and a support surface 66. The wall 64 extends from the top surface 54 to the support surface 66.

The support surface 66 extends from the wall 64 to the angled flat face 60. The wall 64 is completely flat or planar and angled at an angle 68 with respect to an imaginary vertical line "V". The imaginary vertical line "V" is perpendicular to the bottom surface 52 and parallel to the electron beam 38. Angle 68 is 20 degrees relative to the imaginary vertical line V. Angle 68 allows the sample mount 14 to be pre-tilted at the desired angle prior to placement in the SEM 12. The support surface 66 has a complementary shape with the side surface 21 of the sample mount 14. Therefore, in the example provided, the support surface 66 is semi-circular with a matching or slightly larger radius with the sample mount 14. The support surface 66 is disposed 90 degrees relative to the wall 64. When the sample mount 14 is placed within the orientation tool 10, the back surface 17 contacts or abuts the wall 64 and the side surface 21 fits within the support surface 66. The polished surface 19 extends out from the orientation tool 10 above the top surface 54 and out from the angled flat face 60 (best seen in FIG. 1). Thus, the polished surface 19 of the sample mount 14 is oriented twenty degrees relative to the vertical line V and the electron beam 38 and has a clear, close line of sight to the detector 22.

Figure 5:
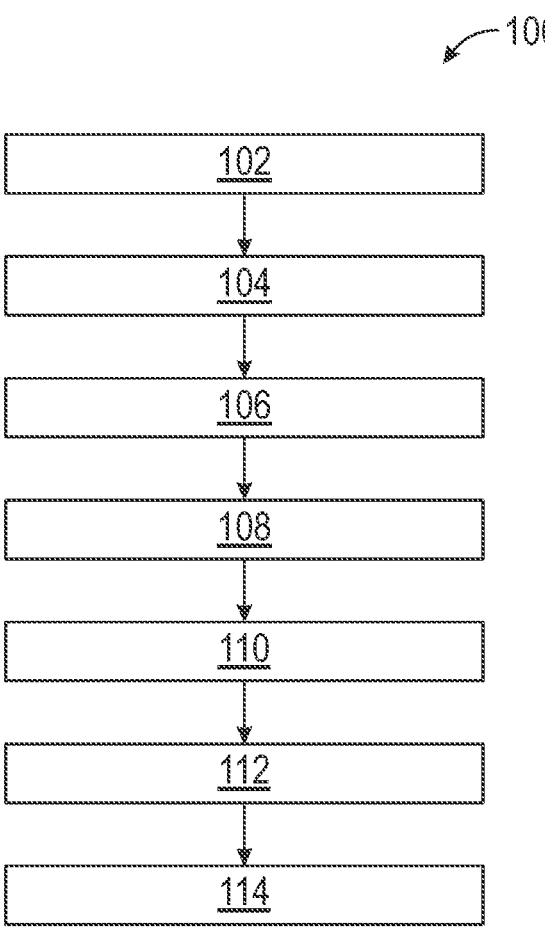
FIG. 5 is a flow chart of an example method for electron backscatter diffraction analysis.

Referring to FIG. 5, a flow chart of an example method 100 for initiating an electron backscatter diffraction measurement in the SEM 12 using the orientation tool 10 is shown. The method 100 runs at least partially on the controller 24. At step 102, the sample 15 is mounted in the sample mount 14, such as by using cold or hot mounting methods. The sample 15 is preferably mounted near an edge of the sample mount 14 so that a working distance between the sample 15 and the electron beam column 20 of the SEM 12 is minimized. More than one sample 15 may be mounted in the sample mount 14 to evaluate more than one sample at a time.

At step 104, the sample 15 is polished, using a vibratory polisher machine (not shown). The vibratory polisher machine prepares a high quality polished surface on the sample 15 by removing minor deformations remaining after suitable sample preparation. The sample 15 may be polished in a horizontal position.

At step 106, a calibrated silicon sample is attached near the sample 15 on the polished surface 19 of the sample mount 14, such as by using carbon tape. The calibrated silicon sample is used as a reference for determining the EBSD quality. It should be appreciated that attaching the calibrated silicon sample is optional and that step 104 may proceed directly to step 108.

At step 108, the sample mount 14 is inserted into the mount portion 62 of the orientation tool 10. In this manner, the sample 15 is oriented at 20 degrees from a vertical axis, i.e., the sample 15 is pre-tilted.

At step 110, the orientation tool 10 is placed into the locating collar 30. The locating flanges 56, 58 fit within the slots 32 and align the orientation tool 10 relative to the locating collar 30. A conduction path from the sample 15 to the SEM may be created, such as by using copper tape.

At step 112, the locating collar 30, orientation tool 10, sample mount 14, and sample 15 are placed within the specimen chamber 16. The sample 15 is oriented to face the detector 22.

At step 114, the electron beam 38 is focused on the sample 15 at an appropriate working distance. The EBSD software application is opened with specimen geometry of pre-tilted sample of 70 degrees from horizontal/20 degrees from vertical indicated. Evaluation of the sample may proceed in a known manner. Optionally, the silicon calibration sample may be used as a reference at the same detector distance for calibration (i.e., moving the detector horizontally between the test sample and the calibration sample, both of which remain at the same distance from the detector.)

The description of the present disclosure is merely exemplary in nature and variations that do not depart from the general sense of the present disclosure are intended to be within the scope of the present disclosure. Such variations are not to be regarded as a departure from the spirit and scope of the present disclosure.

What is claimed is:

1. A system for evaluating a sample within a scanning electron microscope (SEM), the system comprising:
a locating collar configured to be fixed within the SEM;
a sample mount having a back surface, a polished surface, and a side surface extended from the back surface to the polished surface, wherein a sample evaluation area is exposed within the polished surface;
an orientation tool disposed within the locating collar, the orientation tool comprising:
a body having a bottom surface and a top surface;
an angled flat face extending from adjacent the bottom surface to the top surface; and
a mount portion formed in the body between the top surface and the angled flat face, the mount portion defined by a wall and a support surface, wherein the wall extends from the top surface to the support surface and the support surface extends from the wall to the angled flat face, wherein the wall is angled at 20 degrees with respect to an imaginary vertical line perpendicular to the bottom surface, and
wherein the sample mount is disposed within the mount portion and the back surface abuts the wall, the side surface abuts the support surface, and the polished surface is angled at 20 degrees relative to a vertical axis of the SEM.

2. The system of claim 1 wherein the locating collar includes a slot formed in an upper surface of the locating collar.

3. The system of claim 2 wherein the orientation tool includes a locating flange extending out from the body, and the locating flange is disposed within the slot of the locating collar to orient the orientation tool relative to the locating collar.

4. The system of claim 1 wherein the wall and back surface are planar.

5. The system of claim 1 wherein the support surface and side surface are complimentary shapes.

6. The system of claim 1 wherein the angled flat face is angled with respect to the bottom surface at an angle less than 90 degrees.

7. The system of claim 1 wherein the support surface is disposed 90 degrees relative to the wall.

8. The system of claim 1 further comprising an electron backscatter diffraction (EBSD) detector disposed within the SEM, wherein the orientation tool orients the sample mount and the sample relative to the EBSD detector at an angle.

9. The system of claim 1, wherein the back surface and the polished surface of the sample mount are parallel to each other.

10. The system of claim 1, wherein the sample mount is generally cylindrical.

11. A method for initiating an electron backscatter diffraction measurement in a chamber of a scanning electron microscope (SEM), the method comprising:
providing a system for evaluating a sample within the SEM, the system comprising:

a locating collar configured to be fixed within the SEM;
a sample mount having a back surface, a polished surface, and a side surface extended from the back surface to the polished surface, wherein a sample evaluation area is exposed within the polished surface;
an orientation tool disposed within the locating collar, the orientation tool comprising:
a body having a bottom surface and a top surface;
an angled flat face extending from adjacent the bottom surface to the top surface; and
a mount portion formed in the body between the top surface and the angled flat face, the mount portion defined by a wall and a support surface, wherein the wall extends from the top surface to the support surface and the support surface extends from the wall to the angled flat face, wherein the wall is angled at 20 degrees with respect to an imaginary vertical line perpendicular to the bottom surface, and
wherein the sample mount is disposed within the mount portion and the back surface abuts the wall, the side surface abuts the support surface, and the polished surface is angled at 20 degrees relative to a vertical axis of the SEM;
mounting the sample in the sample mount near an edge of the polished surface;
placing the sample mount into the mount portion of the orientation tool, wherein the orientation tool orients the sample at an angle of 20 degrees from a vertical axis of the orientation tool;
placing the orientation tool and sample on the sample mount into the locating collar; and
placing the locating collar with the sample into the chamber of the SEM with the sample facing toward an EBSD detector.

12. The method of claim 11, further including vibratory polishing the sample while in a horizontal position in the sample mount.

13. The method of claim 11, further including creating a conduction path from the sample to the locating collar using copper tape prior to placing the locating collar with the sample into the chamber of the SEM.

14. The method of claim 11, further including aligning the orientation tool relative to the locating collar by inserting a locating flange on the orientation tool into a slot in the locating collar.

15. A system for evaluating a sample within a scanning electron microscope (SEM), the system comprising:
a locating collar configured to be fixed within the SEM, wherein the locating collar includes a slot formed in an upper surface of the locating collar;
a sample mount having a back surface, a polished surface, and a side surface extended from the back surface to the polished surface, wherein a sample evaluation area is exposed within the polished surface;
an orientation tool disposed within the locating collar, the orientation tool comprising:
a body having a bottom surface and a top surface;
an angled flat face extending from adjacent the bottom surface to the top surface; and
a mount portion formed in the body between the top surface and the angled flat face, the mount portion defined by a wall and a support surface, wherein the wall extends from the top surface to the support surface and the support surface extends from the wall to the angled flat face, wherein the wall is angled at 20 degrees with respect to an imaginary vertical line perpendicular to the bottom surface, and wherein the sample mount is disposed within the mount portion and the back surface abuts the wall, wherein the support surface and side surface are complimentary shapes, the side surface abuts the support surface, and the polished surface is angled at 20 degrees relative to a vertical axis of the SEM.

16. The system of claim 15 wherein the orientation tool includes a locating flange extending out from the body, and the locating flange is disposed within the slot of the locating collar to orient the orientation tool relative to the locating collar.

17. The system of claim 15 wherein the wall and back surface are planar.

18. The system of claim 15 wherein the angled flat face is angled with respect to the bottom surface at an angle less than 90 degrees.

19. The system of claim 15 wherein the support surface is disposed 90 degrees relative to the wall.

20. The system of claim 15 further comprising an electron backscatter diffraction (EBSD) detector disposed within the SEM, wherein the orientation tool orients the sample mount and the sample relative to the EBSD detector at an angle.

* * * * *